(12) United States Patent
Chan et al.

(10) Patent No.: US 9,617,411 B2
(45) Date of Patent: Apr. 11, 2017

(54) ORGANIC-INORGANIC HYBRID RESIN, MOLDING COMPOSITION, AND PHOTOELECTRIC DEVICE EMPLOYING THE SAME

(71) Applicant: INDUSTRIAL TECHNOLOGY RESEARCH INSTITUTE, Hsinchu (TW)

(72) Inventors: Ying-Nan Chan, Erlin Township (TW); Shu-Chen Huang, Hsinchu (TW); Wen-Bin Chen, Tainan (TW); Kai-Chi Chen, Zhubei (TW); Chih-Hao Lin, Taoyuan (TW); Hsun-Tien Li, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 91 days.

(21) Appl. No.: 14/596,693

(22) Filed: Jan. 14, 2015

(65) Prior Publication Data

US 2015/0197631 A1    Jul. 16, 2015

Related U.S. Application Data

(60) Provisional application No. 61/927,703, filed on Jan. 15, 2014.

(30) Foreign Application Priority Data

Dec. 25, 2014 (TW) .............................. 103145420 A

(51) Int. Cl.
*H01L 33/60* (2010.01)
*C08L 63/00* (2006.01)
(Continued)

(52) U.S. Cl.
CPC .............. *C08L 63/00* (2013.01); *C08G 77/58* (2013.01); *C08G 77/045* (2013.01); *C08G 77/14* (2013.01); *C08L 2203/20* (2013.01); *H01L 33/60* (2013.01)

(58) Field of Classification Search
CPC ... C08G 77/398; C08G 77/045; C07F 7/0858; C07F 7/28; C07F 7/0876; C08L 83/08
See application file for complete search history.

(56) References Cited

U.S. PATENT DOCUMENTS 6,121,342 A * 9/2000 Suzuki .................. C08G 77/14
522/148
7,781,525 B2    8/2010 Yano et al.
(Continued)

FOREIGN PATENT DOCUMENTS

CN    103483588 A    1/2014
TW    200900448 A    1/2009
(Continued)

OTHER PUBLICATIONS

Taiwan Office Action dated Jun. 15, 2015 for Appl. No. 103145420.
(Continued)

*Primary Examiner* — Ermias Woldegeorgis
(74) *Attorney, Agent, or Firm* — Birch, Stewart, Kolasch & Birch, LLP

(57) ABSTRACT

An organic-inorganic hybrid resin, a molding composition, and a photoelectric device employing the same are disclosed. The organic-inorganic hybrid resin is a reaction product of a composition, wherein the composition includes: 0.1-10 parts by weight of reactant (a), and 100 parts by weight of reactant (b). In particular, the reactant (a) is a silsesquioxane prepolymer with metal oxide clusters, and the metal oxide cluster includes Ti, Zr, Zn, or a combination thereof. The reactant (b) includes an epoxy resin.

29 Claims, 1 Drawing Sheet

(51) Int. Cl.
*C08G 77/58* (2006.01)
*C08G 77/04* (2006.01)
*C08G 77/14* (2006.01)

(56) References Cited

U.S. PATENT DOCUMENTS

| | | | |
|---|---|---|---|
| 8,163,819 B2 | 4/2012 | Graham et al. | |
| 8,338,527 B2 | 12/2012 | Morita et al. | |
| 8,721,919 B2 | 5/2014 | Huang et al. | |
| 2009/0247670 A1 | 10/2009 | Hamada et al. | |
| 2010/0140638 A1 | 6/2010 | Kotani et al. | |
| 2010/0155739 A1 | 6/2010 | Kuramoto et al. | |
| 2011/0054072 A1 | 3/2011 | Sawada et al. | |
| 2012/0041170 A1 | 2/2012 | Benes et al. | |
| 2013/0144026 A1 | 6/2013 | Su et al. | |
| 2013/0158165 A1 | 6/2013 | Han et al. | |
| 2013/0334458 A1* | 12/2013 | Huang | C08G 77/398 252/182.3 |
| 2015/0099848 A1* | 4/2015 | Fish | B05D 3/0254 524/588 |

FOREIGN PATENT DOCUMENTS

| | | |
|---|---|---|
| TW | I331619 B | 10/2010 |
| TW | I401270 A | 7/2013 |
| TW | 201350524 A | 12/2013 |

OTHER PUBLICATIONS

Lu et al., "High refractive index organic-inorganic nanocomposites: design, synthesis and application", J. Mater. Chem., vol. 19, 2009 (published on the web Feb. 4, 2009), pp. 2884-2901.

Mori et al., "Silsesquioxane-Based Nanoparticles Formed via Hydrolytic Condensation of Organotriethoxysilane Containing Hydroxy Groups", Macromolecules, vol. 37, No. 14, 2004 (Published on Web Jun. 3, 2004), pp. 5228-5238.

Nishikubo et al., "A Novel Polyaddition of Bis(epoxide)s with Triazine Diaryl Ether for the Synthesis of Poly(ether)s Containing Triazine Group in the Main Chain", Journal of Polymer Science: Part A: Polymer Chemistry, vol. 38, 2000, pp. 3604-3611.

Wen et al., "Organic/Inorganic Hybrid Network Materials by the Sol-Gel Approach", Chem. Mater., vol. 8, No. 8, 1996(Abstract published in Advance ACS Abstracts, Aug. 1, 1996), pp. 1667-1681.

Zeng et al., "Free volume hole size of Cyanate ester resin/Epoxy resin interpenetrating networks and its correlations with physical properties", Radiation Physics and Chemistry, vol. 79, 2010, pp. 966-975.

Chinese Office Action and Search Report, dated Sep. 27, 2016, for Chinese Application No. 201510015066.2.

* cited by examiner

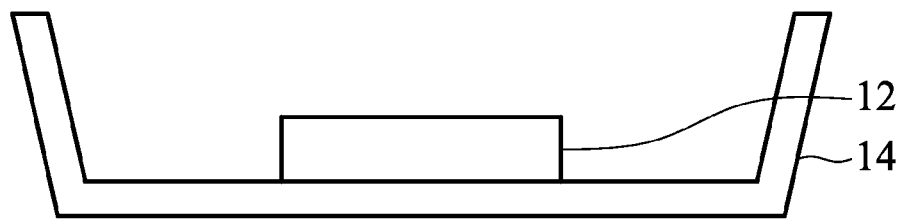

ORGANIC-INORGANIC HYBRID RESIN, MOLDING COMPOSITION, AND PHOTOELECTRIC DEVICE EMPLOYING THE SAME

CROSS REFERENCE TO RELATED APPLICATION

This application claims the benefit of U.S. Provisional Application No. 61/927,703, filed on Jan. 15, 2014, which provisional application is hereby incorporated herein by reference.

The application is based on, and claims priority from, Taiwan Application Serial Number 103145420, filed on Dec. 25, 2014, the disclosure of which is hereby incorporated by reference herein in its entirety.

TECHNICAL FIELD

The disclosure relates to an organic-inorganic hybrid resin, molding composition, and photoelectric device employing the same.

BACKGROUND

The light-emitting diode (LED) has the advantages of being power saving and having a small volume, long lifetime, fast response, low pollution, high reliability and large module flexibility, and so LEDs are widely applied in technical fields. Currently, as technology develops, the efficiency and the brightness of LEDs are continuously being enhanced so that the range of applications is enlarged to cover backlight modules of displays and a light source in vehicles. In the near further, it is possible that the LEDs will replace fluorescent lamps to become the next-generation light source. Furthermore, LEDs with the high power and high brightness will become the mainstream of future development, and the demands on them will gradually increase.

Presently, the package structure (such as a reflective cup) of a light-emitting diode is made of resin or a ceramic material. Although the ceramic materials have high mechanical strength, a ceramic material is not suitable for fabricating reflective cups of a smaller size. Furthermore, reflective cups made of a ceramic material have an inferior reflectivity. Therefore, a reflective cup used in the device having a light-emitting diode as the light source is generally made of resin.

The resin conventionally used in a molding composition (such as polyphthalamide, PPA) is apt to be yellowed and deteriorated during high-temperature and long-term operation, due to the inferior thermal and light stability. In addition, due to the low reactivity and inferior flowability during the transfer molding process, the molding composition employing the conventional resin exhibits inferior processability and has a longer molding time.

Accordingly, a molding composition with high thermal and light stability, improved processability, and short molding time is desired for solving the aforementioned problems.

SUMMARY

According to embodiments of the disclosure, the disclosure provides an organic-inorganic hybrid resin, which is a reaction product of a first composition, wherein the composition includes: 0.1-10 parts by weight of reactant (a), wherein the reactant (a) is a silsesquioxane prepolymer with metal oxide clusters, and wherein the metal oxide cluster includes titanium, zirconium, zinc, or combination thereof; and 100 parts by weight of reactant (b), wherein the reactant (b) is an epoxy resin.

According to another embodiment of the disclosure, the disclosure also provides a molding composition. The molding composition includes: the aforementioned organic-inorganic hybrid resin; an inorganic filler; a hardener; and a white pigment.

According to other embodiments of the disclosure, the disclosure also provides a photoelectric device. The photoelectric device includes: a reflective cup; and a photoelectric element disposed in the reflective cup, wherein the reflective cup is a condensate obtained by subjecting the aforementioned molding composition to a kneading process and a transfer molding process.

A detailed description is given in the following embodiments with reference to the accompanying drawings.

BRIEF DESCRIPTION OF THE DRAWINGS

FIG. 1 is a schematic view of a photoelectric device according to an embodiment of the disclosure.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

The disclosure provides an organic-inorganic hybrid resin, molding composition, and photoelectric device employing the same. The organic-inorganic hybrid resin of the disclosure is prepared by reacting 0.1 to 10 parts by weight of silsesquioxane prepolymer having metal oxide clusters (which has function groups with rapid reactivity) with 100 parts by weight of epoxy resin, in order to ensure that the obtained organic-inorganic hybrid resin maintains a substantially non-flowable state at a temperature less than 50° C. (i.e. having a melting point of larger than 50° C.), and exhibits a melt flowability and has a melt viscosity between 100 mPa·s and 10,000 mPa·s when heating to a temperature between 80° C. and 150° C. On the other hand, the organic-inorganic hybrid resin of the disclosure can further mix with another epoxy resin, a hardener, an inorganic filler, a white pigment, and/or an additive to form a molding composition. The product obtained by subjecting the molding composition of the disclosure to a kneading process exhibits high flowability during a transfer molding process, resulting in improved processability. In addition, due to the reactable epoxy groups of the organic-inorganic hybrid resin, the molding composition exhibits a rapid reactivity and can be cured in less than 150 sec during the transfer molding process. Moreover, the condensate obtained by subjecting the molding composition of the disclosure to the kneading process and the transfer molding process is white in color. The condensate has a reflectivity that is greater than 90% at a wavelength of 450 nm, and high thermal and light stability. Therefore, the condensate obtained from the molding composition can be widely applied in the package structure of various photoelectric devices.

The organic-inorganic hybrid resin of the disclosure can be the reaction product of a composition, wherein the composition includes about 0.1 to 10 parts by weight (such as 1-10 parts by weight) of reactant (a) and 100 parts by weight of reactant (b). The reactant (a) is a silsesquioxane prepolymer with metal oxide clusters, wherein the metal oxide cluster includes titanium, zirconium, zinc, or combination thereof. The reactant (b) can be an epoxy resin. When the amount of the reactant (a) (silsesquioxane prepolymer with metal oxide clusters) is too high, the melting temperature of the organic-inorganic hybrid resin is higher than 150° C. (such as higher than 200° C.) resulting in low reactivity, low flowability, and low processability of the molding material prepared form the organic-inorganic hybrid resin. In addition, due to the specific weight ratio between the silsesquioxane prepolymer with metal oxide clusters and the epoxy resin, the organic-inorganic hybrid resin of the disclosure has a melt viscosity between 100 mPa·s and 10,000 mPa·s at a range of 80° C. to 120° C. Furthermore, the organic-inorganic hybrid resin of the disclosure has reactable epoxy groups.

According to the embodiments of the disclosure, the flowability and the processability of the molding material made of the molding composition are determined by modifying the melt viscosity of the organic-inorganic hybrid resin of the molding composition. Furthermore, the reactant (a) (silsesquioxane prepolymer with metal oxide clusters) of the disclosure has a weight-average molecular weight distribution between 2500 g/mol and 7800 g/mol in order to ensure that the molding material made of the molding composition including the resin prepared from the reactant (a) has a sufficient flowability and processability during the transfer molding process.

According to the embodiments of the disclosure, the reactant (a) can be a reaction product of a composition, wherein the composition includes: 1-10 parts by weight of reactant (d), 100 parts by weight of reactant (e), and 5-20 parts by weight of reactant (f). In particular, the reactant (d) can have a structure represented by Formula (I):

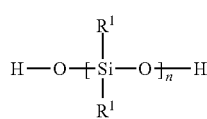

Formula (I)

wherein $R^1$ is independently $C_{1-10}$ alkyl, and n is a positive integer from 4 to 31. The reactant (e) can be titanium alkoxide, zirconium alkoxide, zinc alkoxide, or a combination thereof, such as zirconium ethoxide, zirconium isopropoxide, zirconium n-propoxide, zirconium n-butoxide, zirconium tert-butoxide, zinc ethoxide, zinc isopropoxide, zinc n-propoxide, zinc n-butoxide, zinc tert-butoxide, titanium ethoxide, isopropanol titanium, titanium n-propoxide, titanium n-butoxide, titanium tert-butoxide, or a combination thereof. The reactant (f) can have a structure represented by Formula (II):

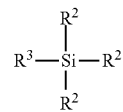

Formula (II)

wherein $R^2$ is independently $C_{1-3}$ alkoxy, and $R^3$ is $C_{3-12}$ epoxy group, $C_{3-12}$ acrylate group, $C_{4-12}$ alkylacryloxy group, or $C_{3-12}$ alkenyl group. According to the embodiments of the disclosure, the reactant (f) can be 2-(3,4-epoxycyclohexyl)-ethyltrimethoxysilane, 3-glycidoxypropyltrimethoxysilane, 3-glycidoxypropyl methoxydiethoxysilane, 3-glycidoxypropyl triethoxysilane, 3-methacryloxypropyl trimethoxysilane, 3-methacryloxypropyl triethoxysilane, 3-acryloxypropyl trimethoxysilane, or a combination thereof. According to the embodiments of the disclosure, the composition can further include 3-10 parts by weight of reactant (g), wherein the reactant (g) is water, ammonium hydroxide ($NH_4OH$), or a combination thereof.

According to the embodiments of the disclosure, the reactant (a) can have a structure represented by Formula (III):

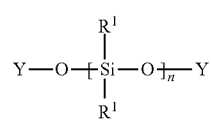

Formula (III)

wherein $R^1$ is independently $C_{1-10}$ alkyl; n is a positive integer from 4 to 31; and, Y is $(MO_{4/2})_l[(MO)_{(4-a)/2}M(OH)_{a/2}]_m[MO_{(4-b)/2}M(OZ)_{b/2}]_p$, wherein, M is metal element, such as zirconium, titanium, or zinc; l is a positive integer from 5 to 20; m is a positive integer from 2 to 8; p is a positive integer from 2 to 5; a is a positive integer from 1 to 2; b is a positive integer from 1 to 2; and, Z is —$SiR^3(R^4)_2$, wherein $R^3$ is independently $C_{3-12}$ epoxy group, $C_{3-12}$ acrylate group, $C_{4-12}$ alkylacryloxy group, or $C_{3-12}$ alkenyl group; and, $R^4$ is independently hydroxyl, or $C_{1-3}$ alkoxy.

In one embodiment, the silsesquioxane prepolymer with metal oxide clusters (reactant (a) can be prepared by the following steps. First, the reactant (d) (silsesquioxane prepolymer with terminal hydroxyl group) and the reactant (e) (metal alkoxide, such as metal n-butoxide ($M(OBu)_4$), and M can be zirconium, titanium, or zinc) are mixed to undergo a reaction, obtaining an intermediate. Next, the intermediate is reacted with the reactant (g) (ammonium hydroxide ($NH_4OH$), and/or water) to undergo a sol-gel reaction to obtain a gel. Next, the reactant (f) (functional group-containing silane) is added to react with the gel, obtaining the silsesquioxane prepolymer with metal oxide clusters. The schematic synthesis pathway of the above reaction is as follows:

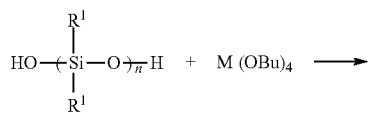

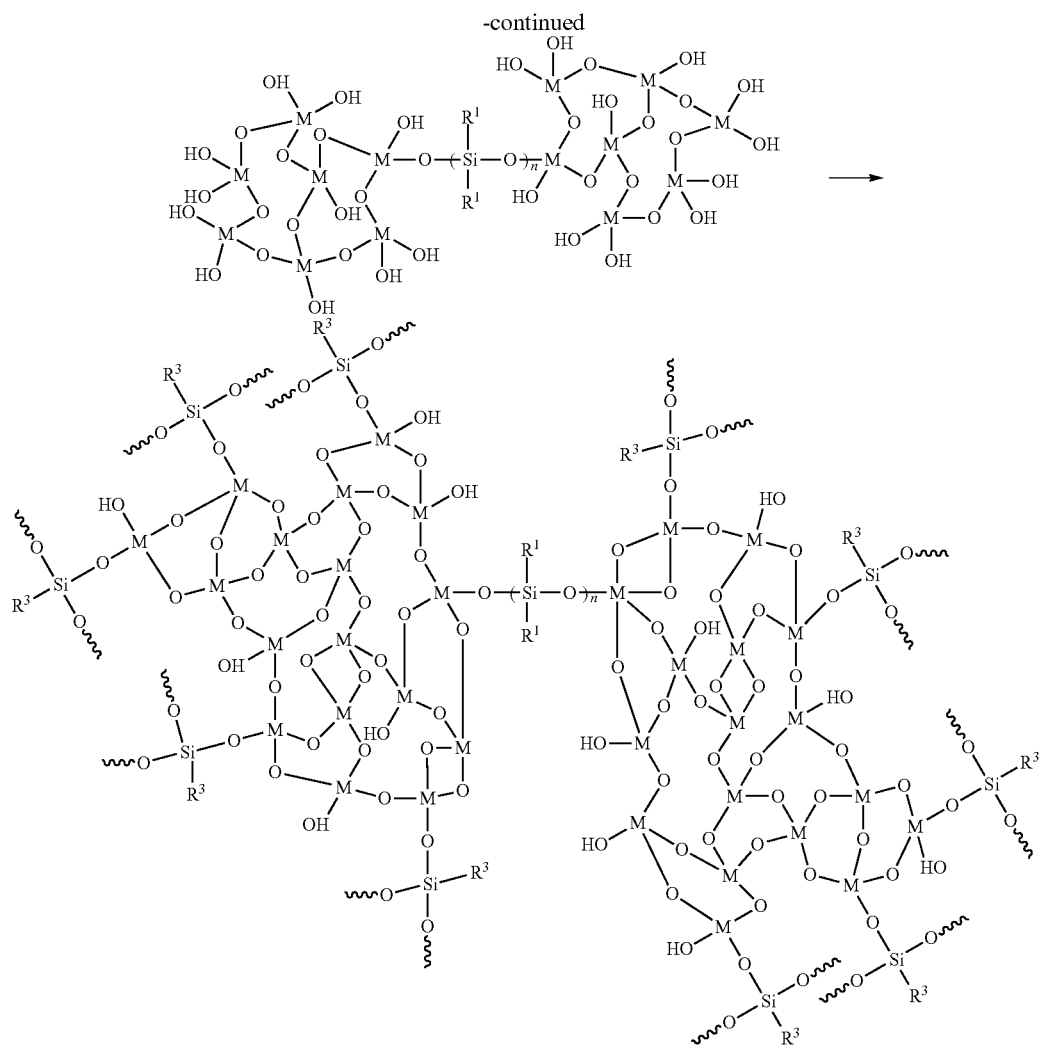

wherein, M is metal element of the metal alkoxide, such as zirconium, titanium, zinc, or a combination thereof. $R^1$, $R^3$, and n have the same definition as above. In addition, the symbol ⸱⸱⸱ represents a bonding, wherein the bonding connects to the Si or M of another organosilane group. In other words, the oxygen of the organosilane of one metal oxide cluster in the silsesquioxane prepolymer may bond to the metal M or Si of an organosilane of another metal oxide cluster. It should be noted that the aforementioned equation is merely an example. One skilled in the art would understand that the size and bonding of the metal oxide cluster structure may be varied by the silsesquioxane prepolymer with metal oxide clusters, organic-inorganic hybrid resin, or molding compound according to various embodiments.

According to the embodiments of the disclosure, the reactant (b) can include triglycidyl isocyanurate epoxy resin, hydrogenated epoxy resin, alicyclic epoxy resin, siloxane-modified resin, or a combination thereof. In the embodiment of the disclosure, the reactant (b) can include siloxane-modified resin, and further include triglycidyl isocyanurate epoxy resin, hydrogenated epoxy resin, alicyclic epoxy resin, or a combination thereof. The siloxane-modified resin of the disclosure has a structure represented by Formula (IV):

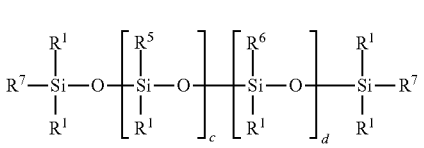

Formula (IV)

wherein $R^1$ is independently $C_{1-10}$ alkyl; $R^5$ is independently $C_{1-10}$ alkyl, or phenyl; $R^6$ is epoxycyclohexylethyl (having a structure represented by

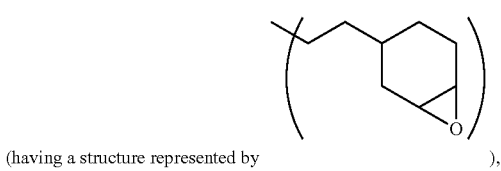

(having a structure represented by            ), or epoxycyclohexylpropyl (having a structure represented by; $R^7$ is independently $C_{1-10}$ alkyl, epoxycyclohexylethyl, or epoxycyclohexylpropyl; and, $1 \leq c \leq 150$, and $0 \leq d \leq 15$, wherein, when d is greater than 0, c/d is between 1 and 10; and when d is equal to 0, at least one $R^7$ is epoxycyclohexylethyl, or epoxycyclohexylpropyl. According to the embodiments of the disclosure, the siloxane-modified resin has a weight-average molecular weight between 400 and 10000.

According to other embodiments of the disclosure, the composition used for preparing the organic-inorganic hybrid resin of the disclosure can further include about 0-35 parts by weight (such as 1-35 parts by weight, or 3-25 parts by weight) of reactant (c) in order to ensure that the organic-inorganic hybrid resin is in a solid state. The reactant (c) is an anhydride, such as succinic anhydride, maleic anhydride, phthalic anhydride (PA), tetrahydrophthalic anhydride (THPA), hexahydrophthalic anhydride (HHPA), methyltetrahydrophthalic anhydride (MTHPA), methyl hexahydrophthalic anhydride (MHHPA), or a combination thereof. In addition, the equivalence ratio between an anhydride group of the reactant (c) and an epoxy group of the reactant (b) is between 0 and 0.5 (such as 0.001 and 0.5, or 0.001 and 0.3), in order to ensure that the organic-inorganic hybrid resin is in a solid state suitable for the subsequent kneading process.

In one embodiment of the disclosure, the organic-inorganic hybrid resin of the disclosure can be prepared by the following steps. First, 100 parts by weight of epoxy resin (reactant (b)), 1-10 parts by weight of silsesquioxane prepolymer with metal oxide clusters (reactant (a)), and/or 0-35 parts by weight of anhydride (reactant (c)) are added into a reactor, and the mixture is dissolved in a solvent (such as: toluene, xylene, hexane, or methyl ethyl ketone). Next, after mixing uniformly, the solvent of the mixture is removed under vacuum for several minutes to several hours. Next, the result is heated at 50-100° C. for 60-240 min. After cooling and aging, the organic-inorganic hybrid resin is obtained.

According to the embodiments of the disclosure, the disclosure also provides a molding composition including the aforementioned organic-inorganic hybrid resin, an inorganic filler, a hardener, and a white pigment. The inorganic filler and the white pigment are present in an amount between 30 wt % and 84 wt % (such as between 45 wt % and 70 wt %), based on the weight of the molding composition. When the weight percentage of the inorganic filler and the white pigment is too low, the molding material obtained has inferior mechanical properties. When the weight percentage of the inorganic filler and the white pigment is too high, the obtained molding material has inferior flowability and reactivity. In addition, the weight ratio between the white pigment and the inorganic filler can be between 0.1 and 0.5, such as between 0.1 and 0.3. The organic-inorganic hybrid resin can have a weight percentage between 11 wt % and 55 wt % (such as between about 15 wt % and 40 wt %), and the hardener is present in an amount between about 3 wt % and 15 wt %, based on the weight of the molding composition. When the weight percentage of the organic-inorganic hybrid resin is too low or the weight percentage of the hardener is too high, the obtained molding material has inferior reactivity and flowability that is too high. When the weight percentage of the inorganic filler and the white pigment is too high or the weight percentage of the hardener is too low, the obtained molding material has inferior processability during the transfer molding process, resulting from the poor flowability.

According to the embodiments of the disclosure, the inorganic filler can include silicon oxide, aluminum hydroxide, magnesium hydroxide, magnesium carbonate, barium carbonate, or a combination thereof. The inorganic filler can be inorganic particles (such as silicon dioxide particles) having a particle size between 0.01 µm and 50 µm. According to another embodiment of the disclosure, the inorganic filler can include inorganic particles having at least two different particle sizes, in order to increase the flowability and processability of the molding material. The white pigment can include titanium oxide, aluminum oxide, magnesium oxide, zirconium oxide, calcium carbonate, zinc sulfide, zinc oxide, or a combination thereof, and the white pigment can have a particle size between 0.01 µm and 100 µm. It should be noted that, in order to ensure that the product obtained by subjecting the molding composition to the kneading process is in a solid state and suitable for the subsequent transfer molding process, the hardener of the molding composition has to be a solid non-aromatic anhydride, such as: tetrahydrophthalic anhydride (THPA), hexahydrophthalic anhydride (HHPA), maleic anhydride, or a combination thereof.

According to the embodiments of the disclosure, the molding composition of the disclosure can further comprise an additive, such as a coupling agent, and/or a mold release agent. The additive is present in an amount between 0.55 wt % and 1.5 wt %, based on the weight of the molding composition. The coupling agent can be a silicon-containing compound having reactable functional groups, such as 2-(3,4-epoxycyclohexyl)-ethyltrimethoxysilane, 3-glycidoxypropyltrimethoxysilane, 3-glycidoxypropyl methyldiethoxysilane, 3-glycidoxypropyl triethoxysilane, 3-methacryloxypropyl methyldimethoxysilane, 3-methacryloxypropyl trimethoxysilane, 3-methacryloxypropyl methyldiethoxysilane, 3-methacryloxypropyl triethoxysilane, N-2-(aminoethyl)-3-aminopropylmethyldimethoxysilane), N-2-(aminoethyl)-3-aminopropyltrimethoxysilane), 3-aminopropyltrimethoxysilane, 3-aminopropyltriethoxysilane, N-phenyl-3-aminopropyltrimethoxysilane, 3-ureidopropyltriethoxysilane, 3-isocyanatepropyltriethoxysilane, 3-chloropropyltrimethoxysilane, 1H,1H,2H,2H-perfluorooctyltriethoxysilane, heptadecafluoro-1,1,2,2-tetrahydrodecyl triethoxysilane, 3-mercaptopropyltrimethoxysilane, 3-mercaptopropylmethyldimethoxysilane, bis(triethoxysilylpropyl)tetrasulfide, decyltrimethoxysilane, hexyltriethoxysilane, 3-acryloxypropyl trimethoxysilane, or a combination thereof. The mold release agent can be alkylphosphonic acid, arylphosphonic acid, fluoroalkylsilane, perfluorochlorosilane, fluorinated alkyl and arylphosphonic acid, fatty acid ester, or a combination thereof.

The molding composition of the disclosure can be subjected to a kneading process to obtain a molding material. According to an embodiment of the disclosure, before the kneading process, the molding composition is stirred and mixed uniformly by an amalgamator. The kneading process can include melting and kneading the molding composition by a mixing roll, kneader, or an extruder at 40-100° C. for 10-120 min. After cooling, the molding material is obtained.

According to another embodiment of the disclosure, the molding material of the disclosure can further be subjected to a transfer molding process to form a condensate (such as white condensate) with a desired shape, wherein the condensate exhibits high thermal and light stability, and has a reflectivity larger than 90% at a wavelength of 450 nm. The transfer molding process has a process temperature between 100° C. and 200° C. Since the molding composition has a rapid reactivity, the molding composition is cured to obtain the condensate within a time interval between 10 sec to 150 sec during the transfer molding process.

According to the embodiments of the disclosure, the condensate obtained by subjecting the molding composition to the kneading process and the transfer molding process can serve as a package structure of the photoelectric device. FIG.

1 is a schematic view of a photoelectric device according to an embodiment of the disclosure. The photoelectric device 10 includes photoelectric element 12 (such as a light-emitting diode, a laser diode, or light receiver), and a pack structure, such as a reflective cup 14, wherein the photoelectric element 12 is disposed in the reflective cup 14. In particular, the reflective cup is the white condensate obtained by subjecting the molding composition to the kneading process and the transfer molding process. Due to the high reflectivity of the ambient light and/or the light emitted by the photoelectric element 12, the white condensate is suitable for serving as the reflective cup to enhance the lighting efficiency of the photoelectric device 10.

The following examples are intended to illustrate the disclosure more fully without limiting the scope, since numerous modifications and variations will be apparent to those skilled in this art.

Preparation of the Silsesquioxane Prepolymer with Metal Oxide Clusters

Preparation Example 1

First, 15.7 g of zirconium n-butoxide (Zr(OBu)$_4$, commercially available from Gelest) and 200 g of butanol were added into a reaction bottle. Next, 0.30 g of silanol terminated polydimethylsiloxanes (DMS-S12, commercially available from Gelest), 0.005 g of ammonium hydroxide (NH$_4$OH), and 45 g of butanol were mixed and stirred, and then the mixture was added dropwise into the reaction bottle. Next, after heating at 40° C. for 64 hrs, the formation of Si—O—Zr bonding was confirmed by determining the absence of peak at 950 cm$^{-1}$ of Fourier-transform infrared (FT-IR) spectroscopy. Next, 390 g of butanol was added into the reaction bottle. Next, 0.12 g of ammonium hydroxide (NH$_4$OH), 0.59 g of deionized water, and 108 g of butanol were mixed, and then the mixture was added into the reaction bottle, and the reaction bottle was heated at 60° C. for 16 hr. Next, after heating at 100° C. for 24 hrs, 130 g of toluene was added into the reaction bottle. After heating at 125° C. for 72 hrs, 2.57 g of 3-glycidoxypropyltrimethoxysilane (Z-6040, commercially available from Dow Corning) was added into the reaction bottle. After heating at 125° C. for 24 hrs, the solvent of the result was removed and the residue was dissolved by toluene, obtaining a silsesquioxane prepolymer with metal oxide clusters (I) containing solution. The silsesquioxane prepolymer with metal oxide clusters (I) was characterized by gel permeation chromatography (GPC). The result shows that the silsesquioxane prepolymer with metal oxide clusters (I) has a weight-average molecular weight distribution between 2800 g/mol and 5000 g/mol.

Preparation Example 2

First, 26.17 g of zirconium n-butoxide (Zr(OBu)$_4$, commercially available from Gelest) and 200 g of butanol were added into a reaction bottle. Next, 0.30 g of silanol terminated polydimethylsiloxanes (DMS-S12, commercially available from Gelest), 0.005 g of ammonium hydroxide (NH$_4$OH), and 72 g of butanol were mixed and stirred, and then the mixture was added dropwise into the reaction bottle. Next, after heating at 40° C. for 64 hrs, the formation of Si—O—Zr bonding was confirmed by determining the absence of peak at 950 cm$^{-1}$ of Fourier-transform infrared (FT-IR) spectroscopy. Next, 390 g of butanol was added into the reaction bottle. Next, 0.2 g of ammonium hydroxide (NH$_4$OH), 0.98 g of deionized water, and 108 g of butanol were mixed, and then the mixture was added into the reaction bottle, and the reaction bottle was heated at 60° C. for 16 hr. Next, after heating at 100° C. for 24 hrs, 130 g of toluene was added into the reaction bottle. After heating at 125° C. for 72 hrs, 4.29 g of 3-glycidoxypropyltrimethoxysilane (Z-6040, commercially available from Dow Corning) was added into the reaction bottle. After heating at 125° C. for 24 hrs, the solvent of the result was removed and the residue was dissolved by toluene, obtaining a silsesquioxane prepolymer with metal oxide clusters (II)-containing solution. The silsesquioxane prepolymer with metal oxide clusters (II) was characterized by gel permeation chromatography (GPC). The result shows that the silsesquioxane prepolymer with metal oxide clusters (II) has a weight-average molecular weight distribution between 4000 g/mol and 7800 g/mol.

Preparation of Organic-Inorganic Hybrid Resin

Preparation Example 3

First, 100 parts by weight of siloxane-modified resin (1) (having a structure represented by

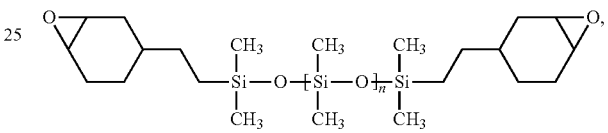

n>1) (having a weight-average molecular weight (Mw) between 800 and 1000, and an epoxy equivalent weight (EEW) between 400 and 500) and 1 parts by weight of silsesquioxane prepolymer with metal oxide clusters (I) were added into a reaction bottle and dissolved in toluene. Next, the solution was stirred at room temperature for 20 min. After mixing uniformly, the solvent of the solution was removed under vacuum for 1 hr. Next, the residue was heated at 80° C. for 120 min. After cooling and aging, the colorless organic-inorganic hybrid resin (I) in a non-flowable state was obtained. Finally, the melting point and melting viscosity of the organic-inorganic hybrid resin (I) were measured, and the results are shown in Table 1.

Preparation Example 4

First, 100 parts by weight of siloxane-modified resin (1) (having a structure represented by

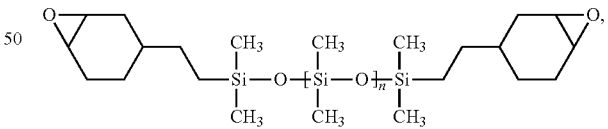

n>1) (having a weight-average molecular weight (Mw) between 800 and 1000, and an epoxy equivalent weight (EEW) between 400 and 500), 1 parts by weight of silsesquioxane prepolymer with metal oxide clusters (I), and 3.4 parts by weight of hexahydrophthalic anhydride (HHPA) were added into a reaction bottle and dissolved in toluene. Next, the solution was stirred at room temperature for 20 min. After mixing uniformly, the solvent of the solution was removed under vacuum for 1 hr. Next, the residue was heated at 90° C. for 80 min. After cooling and aging, the colorless organic-inorganic hybrid resin (II) in a non-flowable state was obtained. Finally, the melting point and melting viscosity of the organic-inorganic hybrid resin (II) were measured, and the results are shown in Table 1.

Preparation Example 5

First, 100 parts by weight of siloxane-modified resin (1) (having a structure represented by

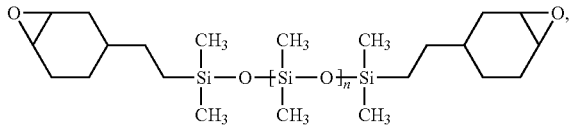

n>1) (having a weight-average molecular weight (Mw) between 800 and 1000, and an epoxy equivalent weight (EEW) between 400 and 500), 5 parts by weight of silsesquioxane prepolymer with metal oxide clusters (I), and 3.4 parts by weight of hexahydrophthalic anhydride (HHPA) were added into a reaction bottle and dissolved in toluene. Next, the solution was stirred at room temperature for 20 min. After mixing uniformly, the solvent of the solution was removed under vacuum for 1 hr. Next, the residue was heated at 80° C. for 140 min. After cooling and aging, the colorless organic-inorganic hybrid resin (III) in a non-flowable state was obtained. Finally, the melting point and melting viscosity of the organic-inorganic hybrid resin (III) were measured, and the results are shown in Table 1.

Preparation Example 6

First, 100 parts by weight of siloxane-modified resin (1) (having a structure represented by

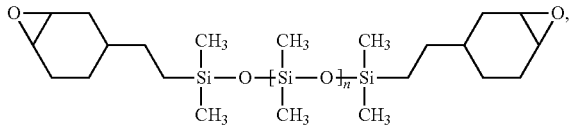

n>1) (having a weight-average molecular weight (Mw) between 800 and 1000, and an epoxy equivalent weight (EEW) between 400 and 500), 10 parts by weight of silsesquioxane prepolymer with metal oxide clusters (I), and 3.4 parts by weight of hexahydrophthalic anhydride (HHPA) were added into a reaction bottle and dissolved in toluene. Next, the solution was stirred at room temperature for 20 min. After mixing uniformly, the solvent of the solution was removed under vacuum for 1 hr. Next, the residue was heated at 90° C. for 140 min. After cooling and aging, the colorless organic-inorganic hybrid resin (IV) in a non-flowable state was obtained. Finally, the melting point and melting viscosity of the organic-inorganic hybrid resin (IV) were measured, and the results are shown in Table 1.

Preparation Example 7

First, 100 parts by weight of siloxane-modified resin (1) (having a structure represented by

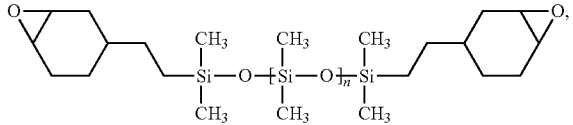

n>1) (having a weight-average molecular weight (Mw) between 800 and 1000, and an epoxy equivalent weight (EEW) between 400 and 500), and 10 parts by weight of silsesquioxane prepolymer with metal oxide clusters (I) were added into a reaction bottle and dissolved in toluene. Next, the solution was stirred at room temperature for 20 min. After mixing uniformly, the solvent of the solution was removed under vacuum for 1 hr. Next, the residue was heated at 80° C. for 240 min. After cooling and aging, the colorless organic-inorganic hybrid resin (V) in a non-flowable state was obtained. Finally, the melting point and melting viscosity of the organic-inorganic hybrid resin (V) were measured, and the results are shown in Table 1.

Preparation Example 8

First, 100 parts by weight of siloxane-modified resin (1) (having a structure represented by

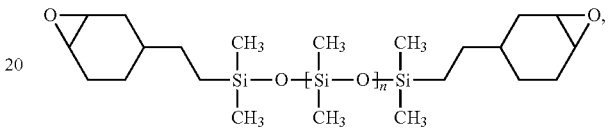

n>1) (having a weight-average molecular weight (Mw) between 800 and 1000, and an epoxy equivalent weight (EEW) between 400 and 500), 5 parts by weight of silsesquioxane prepolymer with metal oxide clusters (II), and 3.4 parts by weight of hexahydrophthalic anhydride (HHPA) were added into a reaction bottle and dissolved in toluene. Next, the solution was stirred at room temperature for 20 min. After mixing uniformly, the solvent of the solution was removed under vacuum for 1 hr. Next, the residue was heated at 90° C. for 110 min. After cooling and aging, the colorless organic-inorganic hybrid resin (VI) in a non-flowable state was obtained. Finally, the melting point and melting viscosity of the organic-inorganic hybrid resin (VI) were measured, and the results are shown in Table 1.

Preparation Example 9

First, 100 parts by weight of siloxane-modified resin (2) (having a structure represented by

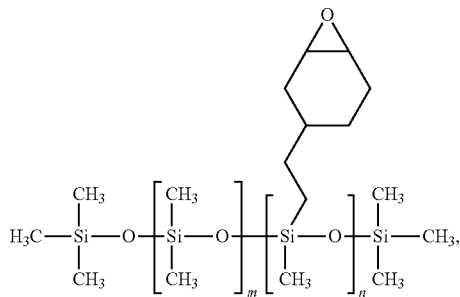

n>1, m>1) (having a weight-average molecular weight (Mw) between 2400 and 2600, and an epoxy equivalent weight (EEW) between 250 and 350), 5 parts by weight of silsesquioxane prepolymer with metal oxide clusters (I), and 4.56 parts by weight of hexahydrophthalic anhydride (HHPA) were added into a reaction bottle and dissolved in toluene. Next, the solution was stirred at room temperature for 20 min. After mixing uniformly, the solvent of the solution was removed under vacuum for 1 hr. Next, the residue was heated at 90° C. for 100 min. After cooling and aging, the colorless organic-inorganic hybrid resin (VII) in a non-flowable state was obtained. Finally, the melting point and melting viscosity of the organic-inorganic hybrid resin (VII) were measured, and the results are shown in Table 1.

Preparation Example 10

First, 100 parts by weight of siloxane-modified resin (1) (having a structure represented by

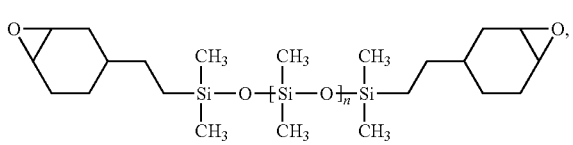

n>1) (having a weight-average molecular weight (Mw) between 800 and 1000, and an epoxy equivalent weight (EEW) between 400 and 500), 5 parts by weight of silsesquioxane prepolymer with metal oxide clusters (I), and 3.69 parts by weight of tetrahydrophthalic anhydride (THPA) were added into a reaction bottle and dissolved in toluene. Next, the solution was stirred at room temperature for 20 min. After mixing uniformly, the solvent of the solution was removed under vacuum for 1 hr. Next, the residue was heated at 80° C. for 150 min. After cooling and aging, the colorless organic-inorganic hybrid resin (VIII) in a non-flowable state was obtained. Finally, the melting point and melting viscosity of the organic-inorganic hybrid resin (VIII) were measured, and the results are shown in Table 1.

Preparation Example 11

First, 80 parts by weight of siloxane-modified resin (1) (having a structure represented by

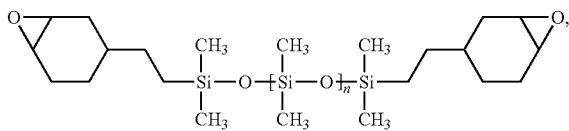

n>1) (having a weight-average molecular weight (Mw) between 800 and 1000, and an epoxy equivalent weight (EEW) between 400 and 500), 20 parts by weight of alicyclic epoxy resin (CEL 2021P, commercially available from DAICEL), 5 parts by weight of silsesquioxane prepolymer with metal oxide clusters (I), and 6.5 parts by weight of hexahydrophthalic anhydride (HHPA) were added into a reaction bottle and dissolved in toluene. Next, the solution was stirred at room temperature for 20 min. After mixing uniformly, the solvent of the solution was removed under vacuum for 1 hr. Next, the residue was heated at 80° C. for 180 min. After cooling and aging, the colorless organic-inorganic hybrid resin (IX) in a non-flowable state was obtained. Finally, the melting point and melting viscosity of the organic-inorganic hybrid resin (IX) were measured, and the results are shown in Table 1.

Preparation Example 12

First, 100 parts by weight of siloxane-modified resin (1) (having a structure represented by

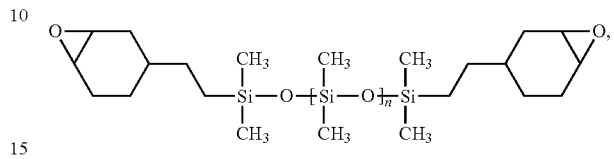

n>1) (having a weight-average molecular weight (Mw) between 800 and 1000, and an epoxy equivalent weight (EEW) between 400 and 500), and 15 parts by weight of silsesquioxane prepolymer with metal oxide clusters (I) were added into a reaction bottle and dissolved in toluene. Next, the solution was stirred at room temperature for 20 min. After mixing uniformly, the solvent of the solution was removed under vacuum for 1 hr. Next, the residue was heated at 90° C. for 140 min. After cooling and aging, the colorless organic-inorganic hybrid resin (X) in a non-flowable state was obtained. Finally, the melting point and melting viscosity of the organic-inorganic hybrid resin (X) were measured, and the results are shown in Table 1.

Preparation Example 13

First, 100 parts by weight of alicyclic epoxy resin (CEL 2021P, commercially available from DAICEL), and 122 parts by weight of methyl hexahydrophthalic anhydride (MHHPA) were added into a reactor and dissolved in toluene. The solution was stirred at room temperature for 20 min. After mixing uniformly, the solvent of the solution was removed under vacuum for 1 hr. Next, the residue was heated at 90° C. for 240 min. After cooling and aging, the resin (I) in a liquid state was obtained.

Preparation Example 14

First, 100 parts by weight of epoxy phenolic resin (ECN1273, commercially available from Ciba-Geigy), and 150 parts by weight of phenolic hardener (HRJ1166, commercially available from Schenectady Chemicals) were added into a reactor and dissolved in toluene. Next, the solution was stirred at room temperature for 20 min. After mixing uniformly, the solvent of the solution was removed under vacuum for 1 hr. Next, the residue was heated at 60° C. for 150 min. After cooling and aging, the resin (II) in a non-flowable state was obtained. Finally, the melting point and melting viscosity of the resin (II) were measured, and the results are shown in Table 1.

TABLE 1

| | components | | | Reaction condition | Melting point (° C.) | Melting viscosity (mPa · s) | outward appearance |
| --- | --- | --- | --- | --- | --- | --- | --- |
| | silsesquioxane prepolymer | epoxy resin | hardener | | | | |
| Organic-inorganic hybrid resin (I) | silsesquioxane prepolymer(I)/ 1 parts by weight | siloxane-modified resin (1)/100 parts by weight | — | 80° C. for 120 min | 120 | 650 | Colorless solid |

TABLE 1-continued

| | components | | | Reaction condition | Melting point (° C.) | Melting viscosity (mPa · s) | outward appearance |
|---|---|---|---|---|---|---|---|
| | silsesquioxane prepolymer | epoxy resin | hardener | | | | |
| Organic-inorganic hybrid resin (II) | silsesquioxane prepolymer(I)/ 1 parts by weight | siloxane-modified resin (1)/100 parts by weight | HHPA/ 3.4 parts by weight | 90° C. for 80 min | 120 | 1100 | Colorless solid |
| Organic-inorganic hybrid resin (III) | silsesquioxane prepolymer(I)/ 5 parts by weight | siloxane-modified resin (1)/100 parts by weight | HHPA/ 3.4 parts by weight | 80° C. for 140 min | 100 | 9200 | Colorless solid |
| Organic-inorganic hybrid resin (IV) | silsesquioxane prepolymer(I)/ 10 parts by weight | siloxane-modified resin (1)/100 parts by weight | HHPA/ 3.4 parts by weight | 90° C. for 140 min | 110 | 5800 | Colorless solid |
| Organic-inorganic hybrid resin (V) | silsesquioxane prepolymer(I)/ 10 parts by weight | siloxane-modified resin (1)/100 parts by weight | — | 80° C. for 240 min | 120 | 5600 | Colorless solid |
| Organic-inorganic hybrid resin (VI) | silsesquioxane prepolymer(II)/ 5 parts by weight | siloxane-modified resin (1)/100 parts by weight | HHPA/ 3.4 parts by weight | 90° C. for 110 min | 120 | 8600 | Colorless solid |
| Organic-inorganic hybrid resin (VII) | silsesquioxane prepolymer(I)/ 5 parts by weight | siloxane-modified resin (2)/100 parts by weight | HHPA/ 4.56 parts by weight | 90° C. for 100 min | 100 | 9300 | Colorless solid |
| Organic-inorganic hybrid resin (VIII) | silsesquioxane prepolymer(I)/ 5 parts by weight | siloxane-modified resin (1)/100 parts by weight | THPA/ 3.69 parts by weight | 80° C. for 150 min | 100 | 7800 | Colorless solid |
| Organic-inorganic hybrid resin (IX) | silsesquioxane prepolymer(I)/ 5 parts by weight | siloxane-modified resin (1)/80 parts by weight; CEL 2021P/20 parts by weight | HHPA/ 6.5 parts by weight | 80° C. for 180 min | 80 | 7800 | Colorless solid |
| Organic-inorganic hybrid resin (X) | silsesquioxane prepolymer(I)/ 15 parts by weight | siloxane-modified resin (1)/100 parts by weight | — | 90° C. for 140 min | Not melting (>200° C.) | | Colorless solid |
| resin (I) | — | CEL 2021P/100 parts by weight | MHHPA/ 122 parts by weight | 90° C. for 240 min | — | — | Colorless liquid |
| resin (II) | — | epoxy phenolic resin/100 parts by weight | phenolic hardener/ 150 parts by weight | 60° C. for 150 min | 120 | 3600 | Brown solid |

As shown in Table 1, when the silsesquioxane prepolymer of the disclosure is present in an amount less than 10 parts by weight and the siloxane-modified resin is present in an amount 100 parts by weight, the obtained organic-inorganic hybrid resin is a colorless solid and suitable for use in a kneading process. Therefore, the silsesquioxane prepolymer of the disclosure can serve as a component of the molding composition. On the other hand, when silsesquioxane prepolymer of the disclosure is present in an amount larger than 10 parts by weight and the siloxane-modified resin is present in an amount 100 parts by weight, the obtained organic-inorganic hybrid resin (X) is a colorless solid. The obtained organic-inorganic hybrid resin (X), however, cannot be melted when heated to a temperature of more than 200° C. due the high crosslinking degree resulting from the high amount of the silsesquioxane prepolymer (I). Therefore, the obtained organic-inorganic hybrid resin (X) cannot serve as a component of the molding composition.

In addition, since the silsesquioxane prepolymer with metal oxide clusters of the disclosure is replaced with the alicyclic epoxy resin in Preparation Example 13, the obtained resin (I) cannot be in a solid state at room temperature even though the amount of the hardener is increased to larger than 100 parts by weight. Therefore, the resin (I)

cannot be used in the kneading process and is not suitable to serve as the component of the molding composition.

On the other hand, since the silsesquioxane prepolymer with metal oxide clusters of the disclosure is replaced with the epoxy phenolic resin in Preparation Example 14, the obtained resin (II) is a brown solid. Therefore, when the resin (II) serves as a component of the molding composition, the obtained condensate would not be a white solid.

Kneading Process of the Molding Composition

Example 1

The organic-inorganic hybrid resin (III) of Preparation Example 5, hexahydrophthalic anhydride (HHPA), inorganic filler (fused silica with average particle sizes (D50) of 4.9 μm and 19.9 μm individually), white pigment (titanium dioxide with an average particle size (D50) of 0.9 μm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (I). Next, the molding composition (I) was subjected to a kneading process at 80° C. for 15 min via a mixing roll, a kneader, or an extruder. After cooling, the result was grinded and then pressed to form a molding compound. Next, the molding compound was subjected to a transfer molding process, and exhibited sufficient flowability at 175° C. (i.e. the molding compound can completely fill into a mold). After the transfer molding process, the obtained condensate solidified within 80 sec. Finally, the reflectivity of the condensate at a wavelength of 450 nm was measured, and the result is shown in Table 2.

Example 2

The organic-inorganic hybrid resin (IV) of Preparation Example 6, hexahydrophthalic anhydride (HHPA), inorganic filler (fused silica with average particle sizes (D50) of 4.9 μm and 19.9 μm individually), white pigment (titanium dioxide with an average particle size (D50) of 0.9 μm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (II). Next, the molding composition (II) was subjected to a kneading process at 60° C. for 30 min via a mixing roll, a kneader, or an extruder. After cooling, the result was grinded and then pressed to form a molding compound. Next, the molding compound was subjected to a transfer molding process, and exhibited sufficient flowability at 175° C. (i.e. the molding compound can completely fill into a mold). After the transfer molding process, the obtained condensate solidified within 80 sec. Finally, the reflectivity of the condensate at a wavelength of 450 nm was measured, and the result is shown in Table 2.

Example 3

The organic-inorganic hybrid resin (VI) of Preparation Example 8, hexahydrophthalic anhydride (HHPA), inorganic filler (fused silica with average particle sizes (D50) of 4.9 μm and 19.9 μm individually), white pigment (titanium dioxide with an average particle size (D50) of 0.9 μm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (III). Next, the molding composition (III) was subjected to a kneading process at 60° C. for 25 min via a mixing roll, a kneader, or an extruder. After cooling, the result was grinded and then pressed to form a molding compound. Next, the molding compound was subjected to a transfer molding process, and exhibited sufficient flowability at 175° C. (i.e. the molding compound can completely fill into a mold). After the transfer molding process, the obtained condensate solidified within 80 sec. Finally, the reflectivity of the condensate at a wavelength of 450 nm was measured, and the result is shown in Table 2.

Example 4

The organic-inorganic hybrid resin (VII) of Preparation Example 9, hexahydrophthalic anhydride (HHPA), inorganic filler (fused silica with average particle sizes (D50) of 4.9 μm and 19.9 μm individually), white pigment (titanium dioxide with an average particle size (D50) of 0.9 μm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (IV). Next, the molding composition (IV) was subjected to a kneading process at 80° C. for 25 min via a mixing roll, a kneader, or an extruder. After cooling, the result was grinded and then pressed to form a molding compound. Next, the molding compound was subjected to a transfer molding process, and exhibited sufficient flowability at 175° C. (i.e. the molding compound can completely fill into a mold). After the transfer molding process, the obtained condensate solidified within 80 sec. Finally, the reflectivity of the condensate at a wavelength of 450 nm was measured, and the result is shown in Table 2.

Example 5

The organic-inorganic hybrid resin (VIII) of Preparation Example 10, hexahydrophthalic anhydride (HHPA), inorganic filler (fused silica with average particle sizes (D50) of 4.9 μm and 19.9 μm individually), white pigment (titanium dioxide with an average particle size (D50) of 0.9 μm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (V). Next, the molding composition (V) was subjected to a kneading process at 50° C. for 30 min via a mixing roll, a kneader, or an extruder. After cooling, the result was grinded and then pressed to form a molding compound. Next, the molding compound was subjected to a transfer molding process, and exhibited sufficient flowability at 175° C. (i.e. the molding compound can completely fill into a mold). After the transfer molding process, the obtained condensate solidified within 80 sec. Finally, the reflectivity of the condensate at a wavelength of 450 nm was measured, and the result is shown in Table 2.

Example 6

The organic-inorganic hybrid resin (III) of Preparation Example 5, tetrahydrophthalic anhydride (THPA), inorganic filler (fused silica with average particle sizes (D50) of 4.9 µm and 19.9 µm individually), white pigment (titanium dioxide with an average particle size (D50) of 0.9 µm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (VI). Next, the molding composition (VI) was subjected to a kneading process at 60° C. for 40 min via a mixing roll, a kneader, or an extruder. After cooling, the result was grinded and then pressed to form a molding compound. Next, the molding compound was subjected to a transfer molding process, and exhibited sufficient flowability at 175° C. (i.e. the molding compound can completely fill into a mold). After the transfer molding process, the obtained condensate solidified within 80 sec. Finally, the reflectivity of the condensate at a wavelength of 450 nm was measured, and the result is shown in Table 2.

Example 7

The organic-inorganic hybrid resin (VI) of Preparation Example 8, hexahydrophthalic anhydride (HHPA), tetrahydrophthalic anhydride (THPA), inorganic filler (fused silica with average particle sizes (D50) of 4.9 µm and 19.9 µm individually), white pigment (titanium dioxide with an average particle size (D50) of 0.9 µm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (VII). Next, the molding composition (VII) was subjected to a kneading process at 60° C. for 30 min via a mixing roll, a kneader, or an extruder. After cooling, the result was grinded and then pressed to form a molding compound. Next, the molding compound was subjected to a transfer molding process, and exhibited sufficient flowability at 175° C. (i.e. the molding compound can completely fill into a mold). After the transfer molding process, the obtained condensate solidified within 80 sec. Finally, the reflectivity of the condensate at a wavelength of 450 nm was measured, and the result is shown in Table 2.

Example 8

The organic-inorganic hybrid resin (V) of Preparation Example 7, hexahydrophthalic anhydride (HHPA), inorganic filler (fused silica with average particle sizes (D50) of 0.7 µm, 4.9 µm, and 19.9 µm individually), white pigment (titanium dioxide with an average particle size (D50) of 0.9 µm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (VIII). Next, the molding composition (VIII) was subjected to a kneading process at 60° C. for 15 min via a mixing roll, a kneader, or an extruder. After cooling, the result was grinded and then pressed to form a molding compound. Next, the molding compound was subjected to a transfer molding process, and exhibited sufficient flowability at 175° C. (i.e. the molding compound can completely fill into a mold). After the transfer molding process, the obtained condensate solidified within 80 sec. Finally, the reflectivity of the condensate at a wavelength of 450 nm was measured, and the result is shown in Table 2.

Comparative Example 1

The organic-inorganic hybrid resin (III) of Preparation Example 5, methyl hexahydrophthalic anhydride (MHHPA), inorganic filler (fused silica with average particle sizes (D50) of 0.7 µm, 4.9 µm, and 19.9 µm individually), white pigment (titanium dioxide with an average particle size (D50) of 0.9 µm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (IX). Next, the molding composition (IX) was subjected to a kneading process at 50° C. for 20 min via a mixing roll, a kneader, or an extruder, and then subject to a transfer molding process. After the transfer molding process, the result was liquid.

Comparative Example 2

The resin (I) of Preparation Example 13, tetrahydrophthalic anhydride (THPA), inorganic filler (fused silica with average particle sizes (D50) of 0.7 µm, 4.9 µm, and 19.9 µm individually), white pigment (titanium dioxide with an average particle size (D50) of 0.9 µm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (X). Next, the molding composition (X) was subjected to a kneading process at 80° C. for 120 min via a mixing roll, a kneader, or an extruder, and then subject to a transfer molding process. After the transfer molding process, the result was liquid.

Comparative Example 3

The resin (II) of Preparation Example 14, hexahydrophthalic anhydride (HHPA), inorganic filler (fused silica with average particle sizes (D50) of 0.7 µm, 4.9 µm, and 19.9 µm individually), white pigment (titanium dioxide with an average particle size (D50) of 0.9 µm), coupling agent (2-(3,4-epoxycyclohexyl)-ethyltrimethoxysilane)), and fatty acid ester mold release agent (Hoechst wax E, commercially available from Clariant) were mixed according to the amounts shown in Table 2 via an amalgamator, obtaining a molding composition (XI). Next, the molding composition (XI) was subjected to a kneading process at 80° C. for 15 min via a mixing roll, a kneader, or an extruder. After cooling, the result was grinded and then pressed to form a molding compound. Next, the molding compound was subjected to a transfer molding process, and exhibited sufficient flowability at 175° C. (i.e. the molding compound can completely fill into a mold). After the transfer molding process, the obtained condensate was solidified within 180 sec. Finally, the reflectivity of the condensate at a wavelength of 450 nm was measured, and the result is shown in Table 2.

TABLE 2

| | Components of molding composition (parts by weight) | | | | | | Conditions of kneading process | outward appearance after kneading process (room temperature) | process ability (175° C.) | reflectivity after transfer molding process (%) (450 nm) |
|---|---|---|---|---|---|---|---|---|---|---|
| | resin | hardener | white pigment | inorganic filler | coupling agent | mold release agent | | | | |
| Example 1 | Organic-inorganic hybrid resin (III)/ 108.4 | HHPA/ 31 | 200 | 325 (4.9 μm)/ 200 (19.9 μm) | 9.2 | 1.9 | 80° C./ 15 min | Solid | good | 92 |
| Example 2 | Organic-inorganic hybrid resin (IV)/ 113.3 | HHPA/ 31 | 250 | 300 (4.9 μm)/ 250 (19.9 μm) | 8.6 | 2.1 | 60° C./ 30 min | Solid | good | 91 |
| Example 3 | Organic-inorganic hybrid resin (VI)/ 108.4 | HHPA/ 31 | 250 | 300 (4.9 μm)/ 250 (19.9 μm) | 9.2 | 2.0 | 60° C./ 25 min | Solid | good | 92 |
| Example 4 | Organic-inorganic hybrid resin (VII)/ 109.6 | HHPA/ 41.6 | 200 | 300 (4.9 μm)/ 200 (19.9 μm) | 8.6 | 2.0 | 80° C./ 25 min | Solid | good | 91 |
| Example 5 | Organic-inorganic hybrid resin (VIII)/ 108.7 | HHPA/ 31 | 200 | 300 (4.9 μm)/ 200 (19.9 μm) | 8.6 | 2.0 | 50° C./ 30 min | Solid | good | 93 |
| Example 6 | Organic-inorganic hybrid resin (III)/ 108.4 | THPA/ 33.2 | 250 | 300 (4.9 μm)/ 250 (19.9 μm) | 8.6 | 2.0 | 60° C./ 40 min | Solid | good | 92 |
| Example 7 | Organic-inorganic hybrid resin (VI)/ 108.4 | HHPA/ 15.3; THPA/ 16.6 | 200 | 300 (4.9 μm)/ 200 (19.9 μm) | 8.6 | 2.0 | 60° C./ 30 min | Solid | good | 93 |
| Example 8 | Organic-inorganic hybrid resin (V)/ 109.9 | HHPA/ 34 | 200 | 75 (0.7 μm)/ 250 (4.9 μm)/ 200 (19.9 μm) | 8.6 | 2.0 | 60° C./ 15 min | Solid | good | 92 |
| Comparative Example 1 | Organic-inorganic hybrid resin (III)/ 108.4 | MHHPA/ 32.4 | 250 | 100 (0.7 μm)/ 200 (4.9 μm)/ 250 (19.9 μm) | 9.2 | 2.0 | 50° C./ 20 min | liquid | — | — |
| Comparative Example 2 | resin (I)/ 222 | THPA/ 36.9 | 250 | 100 (0.7 μm)/ 200 (4.9 μm)/ 250 (19.9 μm) | 9.2 | 2.0 | 80° C./ 120 min | liquid | — | — |
| Comparative Example 3 | resin (II)/ 250 | HHPA/ 46.6 | 250 | 100 (0.7 μm)/ 200 (4.9 μm)/ 250 (19.9 μm) | 9.2 | 2.0 | 80° C./ 15 min | Solid | good | 73 |

As shown in Table 2, the molding compound prepared from the molding composition including the organic-inorganic hybrid resin of the disclosure via the kneading process is in a solid state. When subjecting the molding compounds of Examples 1-8 to the transfer molding process, the obtained condensates exhibit rapid reactivity and high processability, and have a reflectivity larger than 90% at a wavelength of 450 nm (i.e. white solid). Therefore, the condensate of the disclosure is suitable for serving as the package structure (such as a reflective cup) for photoelectric devices. In addition, as shown in Table 2, when the hardener of the molding composition is a liquid anhydride (i.e. Comparative Example 1), the molding material obtained by subjecting the molding composition to the kneading process is still in a liquid state, and not suitable for use in the transfer molding process.

As shown in Table 2, when the molding composition employs the liquid resin of Preparation Example 13 (i.e. Comparative Example 2), the molding material obtained by subjecting the molding composition to the kneading process is still in a liquid state, and not suitable for using in transfer molding process.

On the other hand, when the molding composition employs the brown resin of Preparation Example 14 (i.e. Comparative Example 3), the molding compound obtained by subjecting the molding composition to the kneading process is still brown in the presence of the white pigment, and thus the condensate obtained by the molding compound has a reflectivity of 73% at a wavelength of 450 nm.

Accordingly, due to the specific weight ratio of the silsesquioxane prepolymer with metal oxide clusters and epoxy resin, the organic-inorganic hybrid resin of the disclosure can be in a non-flowable solid state under 50° C., and exhibit melting flowability when heated to a temperature of between 80 and 150° C. Furthermore, the organic-inorganic hybrid resin has a melt viscosity between 100 mPa·s and 10,000 mPa·s at a range of 80° C. to 120° C.

In addition, due to the organic-inorganic hybrid resin of the disclosure, the molding material obtained by subjecting the molding composition to a kneading process exhibits a rapid reactivity and can be cured in less than 150 sec during the transfer molding process. Moreover, the condensate obtained by subjecting the molding composition of the disclosure to the kneading process and the transfer molding process has a reflectivity larger than 90% at a wavelength of 450 nm, and high thermal and light stability. Therefore, the condensate obtained from the molding composition can be widely applied to the package structure of various photoelectric devices.

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. An organic-inorganic hybrid resin, which is a reaction product of a first composition, wherein the first composition comprises:
   0.1-10 parts by weight of reactant (a), wherein the reactant (a) is a silsesquioxane prepolymer with metal oxide clusters, and wherein the metal oxide cluster comprises titanium, zirconium, zinc, or combination thereof; and
   100 parts by weight of reactant (b), wherein the reactant (b) comprises siloxane-modified resin having a structure represented by Formula (IV):

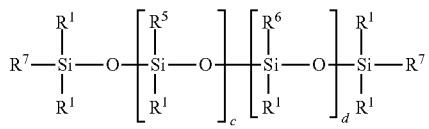

Formula (IV)

wherein $R^1$ is independently $C_{1-10}$ alkyl; $R^5$ is independently $C_{1-10}$ alkyl, or phenyl; $R^6$ is epoxycyclohexylethyl, or epoxycyclohexylpropyl; $R^7$ is independently $C_{1-10}$ alkyl, epoxycyclohexylethyl, or epoxycyclohexylpropyl; and, $1 \le c \le 150$, and $0 \le d \le 15$, wherein, when d is greater than 0, c/d is between 1 and 10; and when d is equal to 0, at least one $R^7$ is epoxycyclohexylethyl, or epoxycyclohexylpropyl.

2. The organic-inorganic hybrid resin as claimed in claim 1, wherein the composition further comprises:
   1-35 parts by weight of reactant (c), wherein the reactant (c) is an anhydride.

3. The organic-inorganic hybrid resin as claimed in claim 2, wherein the reactant (c) comprises succinic anhydride, maleic anhydride, phthalic anhydride (PA), tetrahydrophthalic anhydride (THPA), hexahydrophthalic anhydride (HHPA), methyltetrahydrophthalic anhydride (MTHPA), methyl hexahydrophthalic anhydride (MHHPA), or a combination thereof.

4. The organic-inorganic hybrid resin as claimed in claim 2, wherein the equivalence ratio between an anhydride group of the reactant (c) and an epoxy group of the reactant (b) is between 0.001 and 0.5.

5. The organic-inorganic hybrid resin as claimed in claim 1, wherein the reactant (a) is a reaction product of a second composition, wherein the second composition comprises:
   1-10 parts by weight of reactant (d), wherein the reactant (d) has a structure represented by Formula (I):

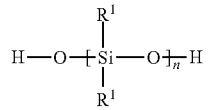

Formula (I)

wherein $R^1$ is independently $C_{1-10}$ alkyl, and n is a positive integer from 4 to 31;
   100 parts by weight of reactant (e), wherein the reactant (e) is titanium alkoxide, zirconium alkoxide, zinc alkoxide, or a combination thereof; and
   5-20 parts by weight of reactant (f), wherein the reactant (f) has a structure represented by Formula (II):

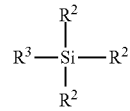

Formula (II)

wherein $R^2$ is independently $C_{1-3}$ alkoxy, and $R^3$ is $C_{3-12}$ epoxy group, $C_{3-12}$ acrylate group, $C_{4-12}$ alkylacryloxy group, or $C_{3-12}$ alkenyl group.

6. The organic-inorganic hybrid resin as claimed in claim 5, wherein the reactant (e) comprises zirconium ethoxide, zirconium isopropoxide, zirconium n-propoxide, zirconium n-butoxide, zirconium tert-butoxide, zinc ethoxide, zinc isopropoxide, zinc n-proxide, zinc n-butoxide, zinc tert-butoxide, titanium ethoxide, isopropanol titanium, titanium n-propoxide, titanium n-butoxide, titanium tert-butoxide, or a combination thereof.

7. The organic-inorganic hybrid resin as claimed in claim 5, wherein the reactant (f)comprises 2-(3,4-epoxycyclohexyl)-ethyltrimethoxysilane, 3-glycidoxypropyltrimethoxysilane, 3-glycidoxypropyl methoxydiethoxysilane, 3-glycidoxypropyl triethoxysilane, 3-methacryloxypropyl trimethoxysilane, 3-methacryloxypropyl triethoxysilane, or 3-acryloxypropyl trimethoxysilane.

8. The organic-inorganic hybrid resin as claimed in claim 5, wherein the second composition further comprises:

3-10 parts by weight of reactant (g), wherein the reactant (g) is water, ammonium hydroxide, or a combination thereof.

9. The organic-inorganic hybrid resin as claimed in claim 1, wherein the reactant (a) has weight-average molecular weight distribution between 2500 g/mol and 7800 g/mol.

10. The organic-inorganic hybrid resin as claimed in claim 1, wherein the reactant (a) has a structure represented by Formula (III):

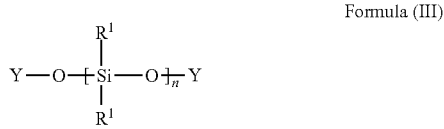

Formula (III)

wherein $R^1$ is independently $C_{1-10}$ alkyl; n is a positive integer from 4 to 31; and, Y is $(MO_{4/2})_l[(MO)_{(4-a)/2}M(OH)_{a/2}]_m[MO_{(4-b)/2}M(OZ)_{b/2}]_p$, wherein, M is metal element; l is a positive integer from 5 to 20; m is a positive integer from 2 to 8; p is a positive integer from 2 to 5; a is a positive integer from 1 to 2, b is a positive integer from 1 to 2; and, Z is —$SiR^3(R^4)_2$, wherein $R^3$ is independently $C_{3-12}$ epoxy group, $C_{3-12}$ acrylate group, $C_{4-12}$ alkylacryloxy group, or $C_{3-12}$ alkenyl group; and, $R^4$ is independently hydroxyl, or $C_{1-3}$ alkoxy.

11. The organic-inorganic hybrid resin as claimed in claim 1, wherein the reactant (b) comprises the siloxane-modified resin having the structure represented by Formula (IV) and one or more of triglycidyl isocyanurate epoxy resin, hydrogenated epoxy resin, and alicyclic epoxy resin.

12. The organic-inorganic hybrid resin as claimed in claim 1, wherein the siloxane-modified resin has a weight-average molecular weight between 400 and 10000.

13. The organic-inorganic hybrid resin as claimed in claim 1, wherein the reactant (b) further comprises triglycidyl isocyanurate epoxy resin, hydrogenated epoxy resin, alicyclic epoxy resin, or a combination thereof.

14. The organic-inorganic hybrid resin as claimed in claim 1, wherein the organic-inorganic hybrid resin has a melting point higher than 50° C., and the organic-inorganic hybrid resin has a melt viscosity between 100 mPa·s and 10,000 mPa·s at a range of 80 ° C. to 120 ° C.

15. A molding composition, comprising:
the organic-inorganic hybrid resin as claimed in claim 1;
an inorganic filler;
a hardener; and
a white pigment.

16. The molding composition as claimed in claim 15, wherein the inorganic filler comprises silicon oxide, aluminum hydroxide, magnesium hydroxide, magnesium carbonate, barium carbonate, or a combination thereof.

17. The molding composition as claimed in claim 15, wherein the white pigment comprises titanium oxide, aluminum oxide, magnesium oxide, zirconium oxide, calcium carbonate, zinc sulfide, zinc oxide, or a combination thereof.

18. The molding composition as claimed in claim 15, wherein the hardener is a solid non-aromatic anhydride.

19. The molding composition as claimed in claim 15, wherein the hardener comprises tetrahydrophthalic anhydride (THPA), hexahydrophthalic anhydride (HHPA), maleic anhydride, or a combination thereof.

20. The molding composition as claimed in claim 15, wherein the inorganic filler and the white pigment are present in an amount between 30 wt % and 84 wt %, based on the weight of the molding composition.

21. The molding composition as claimed in claim 15, wherein the weight ratio between the white pigment and the inorganic filler is between 0.1 and 0.5.

22. The molding composition as claimed in claim 15, wherein the organic-inorganic hybrid resin is present in an amount between 11 and 15 wt %, based on the weight of the molding composition.

23. The molding composition as claimed in claim 15, wherein the hardener is present in an amount between 3 wt % and 15 wt %, based on the weight of the molding composition.

24. The molding composition as claimed in claim 15, further comprising:
an additive, wherein the additive comprises a coupling agent, mold release agent, or a combination thereof.

25. The molding composition as claimed in claim 24, wherein the additive is present in an amount between 0.55 wt % and 1.5 wt %, based on the weight of the molding composition.

26. The molding composition as claimed in claim 15, wherein a condensate, obtained by subjecting the molding composition to a kneading process and a transfer molding process, has a reflectivity higher than 90% at a wavelength of 450 nm.

27. The molding composition as claimed in claim 26, wherein the transfer molding process has a process temperature between 100 ° C. and 200 ° C., and the molding composition is cured to obtain the condensate within a time interval between 10 sec to 150 sec during the transfer molding process.

28. A photoelectric device, comprising:
a reflective cup; and
a photoelectric element disposed in the reflective cup, wherein the reflective cup is a condensate obtained by subjecting the molding composition as claimed in claim 15 to a kneading process and a transfer molding process.

29. The photoelectric device as claimed in claim 28, wherein the photoelectric element comprises a light-emitting diode, laser diode, or light receiver.

* * * * *